United States Patent
Ge et al.

(10) Patent No.: US 6,492,845 B1
(45) Date of Patent: Dec. 10, 2002

(54) LOW VOLTAGE CURRENT SENSE AMPLIFIER CIRCUIT

(75) Inventors: Weiguo Ge, Shenzhen (CN); Congqing Xiong, Shenzhen (CN)

(73) Assignee: Shenzhen STS Microelectronics Co. Ltd. (CN)

( * ) Notice: Subject to any disclaimer, the term of this patent is extended or adjusted under 35 U.S.C. 154(b) by 0 days.

(21) Appl. No.: 10/034,393

(22) Filed: Dec. 27, 2001

(30) Foreign Application Priority Data

Apr. 5, 2001 (CN) ........................................ 01116261 A

(51) Int. Cl.[7] ................................................ G06G 7/12
(52) U.S. Cl. ............................ 327/53; 327/66; 327/561
(58) Field of Search ............................ 327/51, 52, 53, 327/65, 66, 77, 560–563, 103

(56) References Cited

U.S. PATENT DOCUMENTS

| 5,627,494 A | 5/1997 | Somerville ................. 330/257 |
| 5,923,217 A | * 7/1999 | Durec ......................... 330/288 |
| 5,969,574 A | 10/1999 | Legates ....................... 330/288 |
| 6,011,415 A | * 1/2000 | Hahn et al. .................. 327/561 |
| 6,049,469 A | 4/2000 | Forbes et al. ............... 365/208 |
| 6,392,392 B1 | * 5/2002 | Nakahara .................... 323/312 |

OTHER PUBLICATIONS

Maxim Integrated Products, 19–1184: Rev. 0: Dec. 1996, Maxim Low–Cost, Precision, High–Side Current–Sense Amplifier, MAX4172, pp. 1, 6.

* cited by examiner

*Primary Examiner*—Toan Tran
(74) *Attorney, Agent, or Firm*—Lisa K. Jorgenson; Andre Szuwalski

(57) ABSTRACT

A current sense amplifier including a transconductance amplifier to measure a current passing through a sense resistor and generate a reference current indicative of the measured current. A current mirror circuit is connected to the transconductance amplifier and receives the reference current for amplification to generate an amplified output current. A cascode circuit is connected serially to the current mirror circuit to boost an output impedance for the amplifier at the output of the generated amplified output current. The current mirror circuit and cascode circuit of the current sense amplifier are each formed from a pair of transistors sharing a common control node, with the transistors realized using with bipolar or MOS technology.

28 Claims, 3 Drawing Sheets

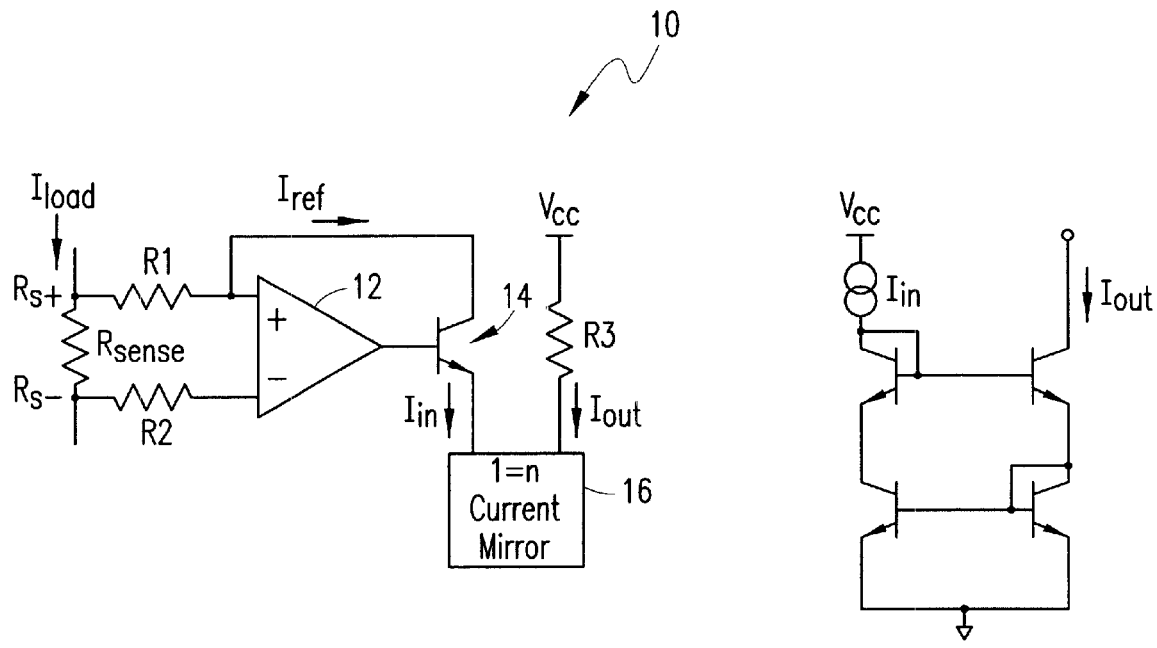
FIG. 1
(PRIOR ART)
FIG. 2
(PRIOR ART)
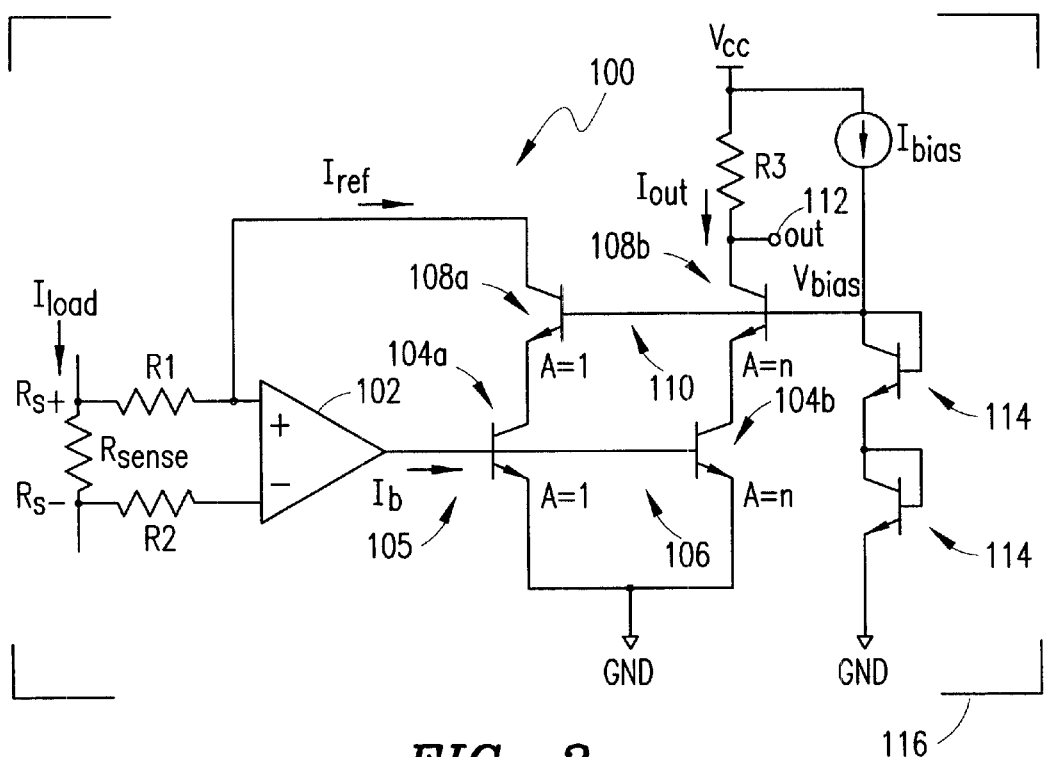
FIG. 3

US 6,492,845 B1

LOW VOLTAGE CURRENT SENSE AMPLIFIER CIRCUIT

BACKGROUND OF THE INVENTION

1. Technical Field of the Invention

The present invention relates to the field of current sense amplifiers.

2. Description of Related Art

Current sense amplifiers are typically used to measure the amount of current supplied by and to a device or component in various types of electronic equipment. Reference is now made to FIG. 1 wherein there is shown a schematic diagram of a typical implementation for a current sense amplifier 10. A current (referred to as $I_{load}$) to be sensed flows through a sense resistor ($R_{sense}$) from a first sensing node ($R_{s+}$) to a second sensing node ($R_{s-}$). The first sensing node ($R_{s+}$) is connected to a first input (+) of an operational amplifier 12 through a resistor R1. The second sensing node ($R_{s-}$) is connected to a second input (−) of the operational amplifier 12 through a resistor R2. The output of the operational amplifier 12 is connected to the base of a transistor 14 whose collector is connected to the first input (+). A current (referred to as $I_{ref}$) flows through the connection between the first input (+) and the collector of the transistor 14. An emitter of the transmitter 14, generates an input current (referred to as $I_{in}$) and, is connected to an input of a 1:n current mirror 16. Vcc is connected to an output of the current mirror 16 through a load resistor R3 for the generation of an output current (referred to as $I_{out}$) The second input (−) of the operational amplifier 12 presents a relatively high impedance. Neglecting the presence of any input bias current at the second input (−), it is recognized that no current flows through the second resistor R2 from the second sensing node ($R_{s-}$). The voltage at both the first input (+) and second input (−) is therefore equal to the voltage at the second sensing node ($R_{s-}$). The voltage drop across the resistor R1 is accordingly equal to the product of $I_{load}$ and $R_{sense}$. The input current $I_{in}$ thus equals the current $I_{ref}$, and ideally then:

$$I_{ref} = I_{load} \cdot (R_{sense}/R1); \quad (1)$$

and $$I_{out} = n \cdot I_{in}; \quad (2)$$

and $$I_{out} = n \cdot I_{load} \cdot (R_{sense}/R1). \quad (3)$$

In practice, however, the value of base current at the transistor 14 cannot be neglected as it is also multiplied by a factor of n in the current mirror 16 and alters the value of the output current $I_{out}$ (of Equation 3) away from ideal. Still further, it is recognized that a current mirror 16 possessing a large factor (for example, n equals approximately twenty for a Wilson current mirror) is not particularly accurate. The value of the input current is actually set as follows:

$$I_{in} = I_{ref}(1+1/\beta) \quad (4)$$

wherein: β is the current gain of the transistor 14.

Reference is now made to FIG. 2 wherein there is shown a schematic diagram of the 1:n current mirror 16. This current mirror has a conventional configuration that is well known to those skilled in the art. A detailed description of the components, interconnection and operation of the current mirror 16 is accordingly not required. Continuing with the foregoing analysis, and specifically with respect to the current mirror 16, the relationship between the input current $I_{in}$ and the output current $I_{out}$ is given by the following:

$$I_{out} = I_{in} \cdot \frac{n \cdot \beta^2 + n \cdot \beta + \beta}{\beta^2 + (n+1) \cdot \beta + n + 1} \quad (5)$$

wherein: β is the current gain of the matched transistors within the current mirror 16. From Equations 4 and 5, the actual value of the output current $I_{out}$ is given by the following:

$$I_{out} = n \cdot I_{ref} \cdot \left(1 - \frac{\left(n - \frac{1}{n} - 1\right) \cdot \beta + \left(n - \frac{1}{n}\right)}{\beta^2 + (n+1) \cdot \beta + n + 1}\right); \text{ and} \quad (6)$$

by taking into account Equation (1);

$$I_{out} = n \cdot I_{load} \cdot \left(\frac{R_{sense}}{R1}\right) \cdot \left(1 - \frac{\left(n - \frac{1}{n} - 1\right) \cdot \beta + \left(n - \frac{1}{n}\right)}{\beta^2 + (n+1) \cdot \beta + n + 1}\right). \quad (7)$$

Now, from a comparison of the foregoing Equations, it is recognized that the actual output current (see, Equation 7) of the current mirror 16 and the current n·$I_{ref}$ that should preferably (and ideally) be output from the current mirror approximately differ from each other by a factor (shown inside the parenthetical of Equation 7) on the order of:

$$\left(n - \frac{1}{n} - 1\right)/\beta.$$

Given a scenario where n is relatively large (for example, greater than or about ten) and β is relatively small (for example, less than or about sixty), this factor can present a significant difference in measured current. In this configuration, the current sense amplifier circuit of FIG. 1 cannot be used for generating a precision current amplifier output.

SUMMARY OF THE INVENTION

A transconductance amplifier measures a current passing through a sense resistor to generate a reference current indicative of the measured current. A current mirror circuit connected to the transconductance amplifier amplifies the reference current to generate an amplified output current. A cascode circuit is connected between the current mirror circuit and output of the generated amplified output current.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1, previously described, is a schematic diagram of a typical implementation for a current sense amplifier;

FIG. 2, previously described, is a schematic diagram of a conventional current mirror for use in the amplifier circuit of FIG. 1;

FIG. 3 is a schematic diagram of a sinking current, bipolar transistor, embodiment of a current sense amplifier in accordance with the present invention;

DETAILED DESCRIPTION OF THE DRAWINGS

Figure 4:
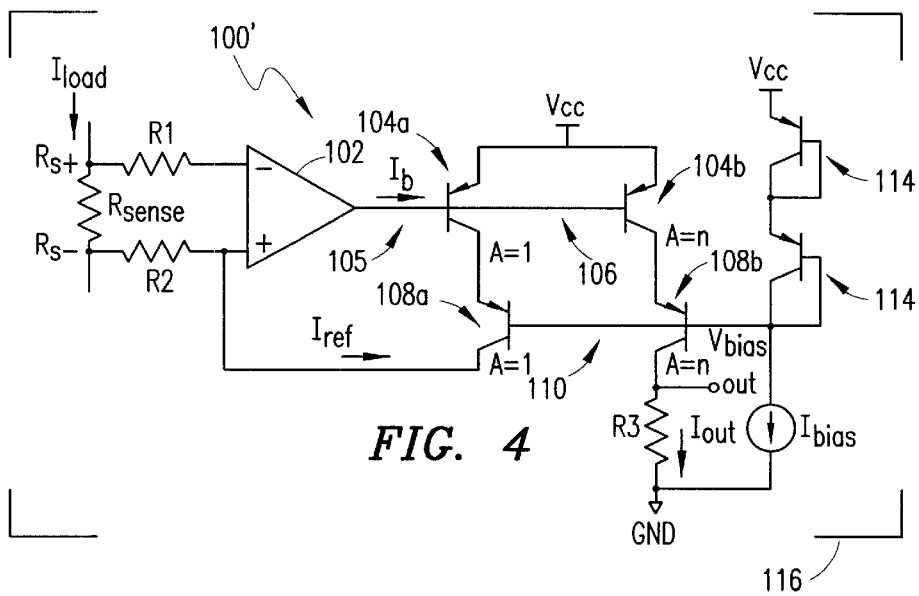
FIG. 4 is a schematic diagram of a sourcing current, bipolar transistor, embodiment of a current sense amplifier in accordance with the present invention.

Reference is now made to FIG. 3 wherein there is shown a schematic diagram of a sinking current, bipolar transistor, embodiment of a current sense amplifier 100 in accordance with the present invention. A current (referred to as $I_{load}$) to be sensed flows through a sense resistor ($R_{sense}$) from a first sensing node ($R_{s+}$) to a second sensing node ($R_{s-}$). The first sensing node ($R_{s+}$) is connected to a first input (+) of an operational amplifier 102 through a resistor R1. The second sensing node ($R_{s-}$) is connected to a second input (−) of the operational amplifier 102 through a resistor R2. The amplifier 102 is accordingly set to operate in differential mode. The output of the operational amplifier 102 is connected to the commonly connected bases of a pair of matched NPN transistors 104a and 104b having a 1:n gain ratio. The emitters of transistors 104a and 104b are connected to each other and to ground. The operational amplifier 102 and first transistor 104a form a basic transconductance amplifier 105. The pair of transistors 104a and 104b form a current mirror circuit 106. Importantly, the output of the operational amplifier 102 is used to drive the base current ($I_b$) of the current mirror 106. A voltage bias signal ($V_{bias}$) is applied to the commonly connected bases of another pair of matched NPN transistors 108a and 108b that also have a 1:n gain ratio. These matched transistors 108a and 108b form a cascode circuit 110. The value for the signal $V_{bias}$ is preferably set at about ground plus two times the base-emitter voltage of the transistors 108 and may provided by connecting two serially connected (matched) NPN transistors 114 in diode configuration between $V_{bias}$ and ground, with the bias currrent for these transistors provided from a current source ($I_{bias}$). The transistors of the cascode circuit 110 and the transistors of the current mirror circuit 106 are connected in serial fashion to effectively boost the output impedance of the amplifier 100 (at output 112). More specifically, the emitter of the first transistor 108a of the cascode circuit 110 is connected to the collector of the first transistor 104a of the current mirror circuit 106. Similarly, the emitter of the second transistor 108b of the cascode circuit 110 is connected to the collector of the second transistor 104b of the current mirror circuit 106. The first input (+) of the operational amplifier is connected to the collector of the first transistor 108a of the cascode circuit 110. A current (referred to as $I_{ref}$) flows through the connection between the first input (+) and the collector of the first transistor 108a. Vcc is connected to the collector of the second transistor 108b through a load resistor R3 (at output 112) for the generation of an output current (referred to as $I_{out}$) The components of the current sense amplifier 100 may be discretely assembled, but are preferably implemented on an monolithic integrated circuit chip 116 (perhaps with other components—not explicitly shown—performing other functions).

In operation, the transistors 104 and 108 can operate in the saturation region to allow the circuit 100 to provide a wide output voltage range from Vcc to near ground. Furthermore, the circuit 100 is capable of operation at a relatively low Vcc of about 2.0V. The current in the collector of transistor 108a (i.e., the current $I_{ref}$) is:

ti $I_{ref} = I_{load} \cdot (R_{sense}/R1)$.

The current in the collector of the transistor 108b (i.e., the current $I_{out}$) is accordingly:

$$I_{out} = n \cdot I_{ref};$$

or $$I_{out} = n \cdot I_{load} \cdot (R_{sense}/R1),$$

if one neglects the affects of the input bias current to the operational amplifier 102. In this circuit configuration, one can ignore the effect of the base current for transistors 104 of the current mirror 106 because the base current is provided by the output of operational amplifier 102 (as opposed to being self-generated as with the current mirror (FIG. 2) of the prior art circuit (FIG. 1)). Thus, the collector current for the transistor 104b and the emitter current for the transistor 108b are very accurately set and given by the following:

$$I_{c(104b)} = n \cdot I_{c(104a)};$$

and $$I_{e(108b)} = n \cdot I_{e(108a)}.$$

The gain (G) of the device 100 is given by:

$$G = \frac{V_{out}}{V_{sense}} = n \cdot \frac{R3}{R1}$$

Accordingly, the gain of the device 100 may be very accurately set through proper selection of the resistance values for the resistors R1 and R3.

Reference is now made to FIG. 4 wherein there is shown a schematic diagram of a sourcing current, bipolar transistor, embodiment of a current sense amplifier 100' in accordance with the present invention. Like or similar components in amplifier 100' have the same reference numbers as for the amplifier 100 of FIG. 3. Noted differences between the circuits of FIGS. 4 and 3 include, with respect to the amplifier 100':

(a) having the matched transistors comprise PNP bipolar transistors;

(b) having the first sensing node ($R_{s+}$) be connected to the second input (−) of the operational amplifier 102 through the resistor R1, and having the second sensing node ($R_{s-}$) be connected to the first input (+) of the operational amplifier 102 through the resistor R2;

(c) having Vcc be connected to both emitters of the transistors 104a and 104b; and (d) having ground be connected through resistor R3 and output 112 to the collector of transistor 108b.

Operation of the amplifier 100' is substantially similar to that described above with respect to the amplifier 100 of FIG. 3. In view of the foregoing, additional detailed description of FIG. 4 beyond what has been provided in connection with FIG. 3 is not deemed necessary.

Figure 5:
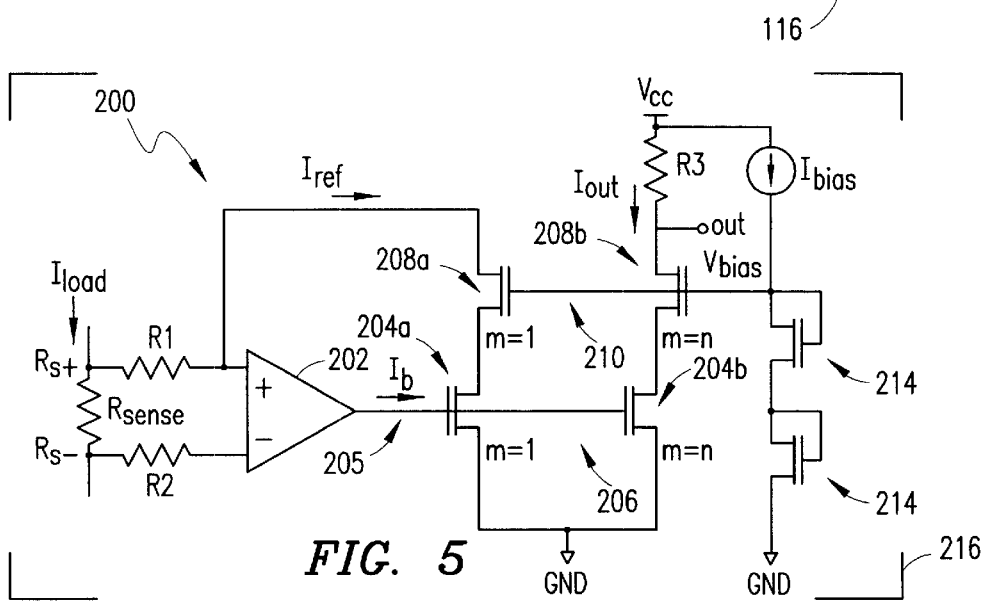
FIG. 5 is a schematic diagram of a sinking current, MOS transistor, embodiment of a current sense amplifier in accordance with the present invention.

Reference is now made to FIG. 5 wherein there is shown a schematic diagram of a sinking current, MOS transistor, embodiment of a current sense amplifier 200 in accordance with the present invention. A current (referred to as $I_{load}$) to be sensed flows through a sense resistor ($R_{sense}$) from a first sensing node ($R_{s+}$) to a second sensing node ($R_{s-}$). The first sensing node ($R_{s+}$) is connected to a first input (+) of an operational amplifier 202 through a resistor R1. The second sensing node ($R_{s-}$) is connected to a second input (−) of the operational amplifier 202 through a resistor R2. The amplifier 202 is accordingly configured to operate in differential mode. The output of the operational amplifier 202 is connected to the commonly connected gates of a pair of matched NMOS transistors 204a and 204b having a 1:n gain ratio. The sources of transistors 204a and 204b are connected to each other and to ground. The operational amplifier 202 and first transistor 204a form a basic transconductance amplifier 205. The pair of transistors 204a and 204b form a current mirror circuit 206. Importantly, the output of the operational amplifier 202 is used to drive the gate current ($I_b$) of the current mirror 206. A voltage bias signal ($V_{bias}$) is applied to the commonly connected gates of another pair of matched NMOS transistors 208a and 208b that also have a 1:n gain ratio. These matched transistors 208a and 208b form a cascode circuit 210. The value for the signal $V_{bias}$ is preferably set at about ground plus two times the voltage threshold of the transistors 208 and may provided by connecting two serially connected (matched) NMOS transistors 114 in diode configuration between $V_{bias}$ and ground, with the bias currrent for these transistors provided from a current source ($I_{bias}$). The transistors of the cascode circuit 210 and the transistors of the current mirror circuit 206 are connected in serial fashion to boost the output impedance of the amplifier 200 (at output 212). More specifically, the source of the first transistor 208a of the cascode circuit 210 is connected to the drain of the first transistor 204a of the current mirror circuit 206. Similarly, the source of the second transistor 208b of the cascode circuit 210 is connected to the drain of the second transistor 204b of the current mirror circuit 206. The first input (+) of the operational amplifier is connected to the drain of the first transistor 208a of the cascode circuit 210. A current (referred to as $I_{ref}$) flows through the connection between the first input (+) and the drain of the first transistor 208a. Vcc is connected to the drain of the second transistor 208b through a load resistor R3 (at output 212) for the generation of an output current (referred to as $I_{out}$) The components of the current sense amplifier 200 may be discretely assembled, but are preferably implemented on a monolithic integrated circuit chip 216 (perhaps with other components—not explicitly shown—performing other functions).

In operation, the transistors 204 and 208 can operate in the triode region to allow the circuit 200 to provide a wide output voltage range from Vcc to near ground. Furthermore, the circuit 200 is capable of operation at a relatively low Vcc at about 2.0V. The current in the drain of transistor 208a (i.e., the current $I_{ref}$) is:

$$I_{ref} = I_{load} \cdot (R_{sense}/R1).$$

The current in the drain of the transistor 208b (i.e., the current $I_{out}$) is accordingly:

$$I_{out} = n \cdot I_{ref};$$

or $$I_{out} = n \cdot I_{load} \cdot (R_{sense}/R1),$$

if one neglects the affects of the input bias current to the operational amplifier 202. The gain (G) of the device 200 is given by:

$$G = \frac{V_{out}}{V_{sense}} = n \cdot \frac{R3}{R1}$$

Accordingly, the gain of the device 200 may be very accurately set through proper selection of the resistance values for the resistors R1 and R3.

Figure 6:
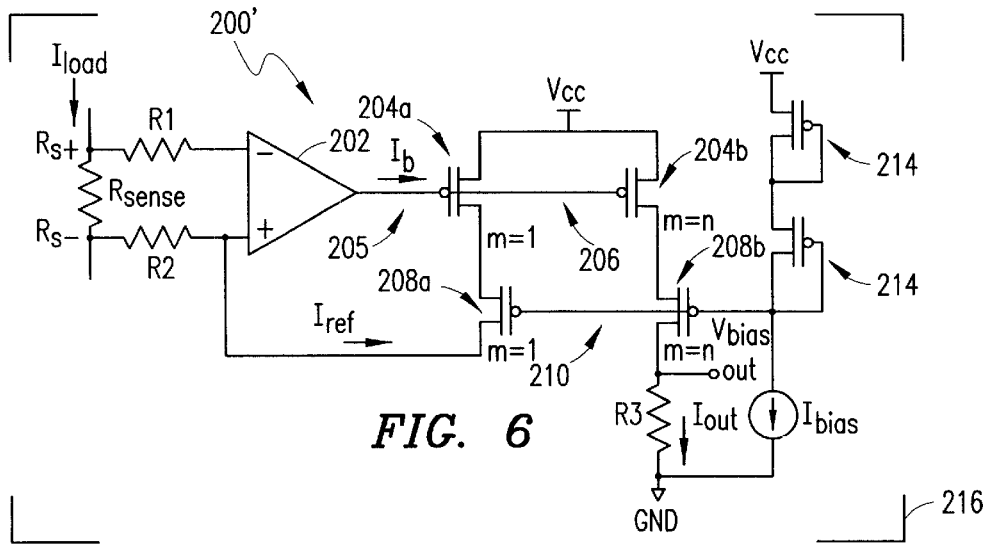
FIG. 6 is a schematic diagram of a sourcing current, MOS transistor, embodiment of a current sense amplifier in accordance with the present invention.

Reference is now made to FIG. 6 wherein there is shown a schematic diagram of a sourcing current, MOS transistor, embodiment of a current sense amplifier 200' in accordance with the present invention. Like or similar components in amplifier 200' have the same reference numbers as for the amplifier 200 of FIG. 5. Noted differences between the circuits of FIGS. 6 and 5 include, with respect to the amplifier 200':

(a) having the matched transistors comprise PMOS transistors;

(b) having the first sensing node ($R_{s+}$) be connected to the second input (−) of the operational amplifier 202 through the resistor R1, and having the second sensing node ($R_{s-}$) be connected to the first input (+) of the operational amplifier 202 through the resistor R2;

(c) having vcc be connected to both sources of the transistors 204a and 204b; and (d) having ground be connected through resistor R3 and output 212 to the drain of transistor 208b. Operation of the amplifier 200' is substantially similar to that described above with respect to the amplifier 200 of FIG. 5. In view of the foregoing, additional detailed description of FIG. 6 beyond what has been provided in connection with FIG. 5 is not deemed necessary.

Figure 7:
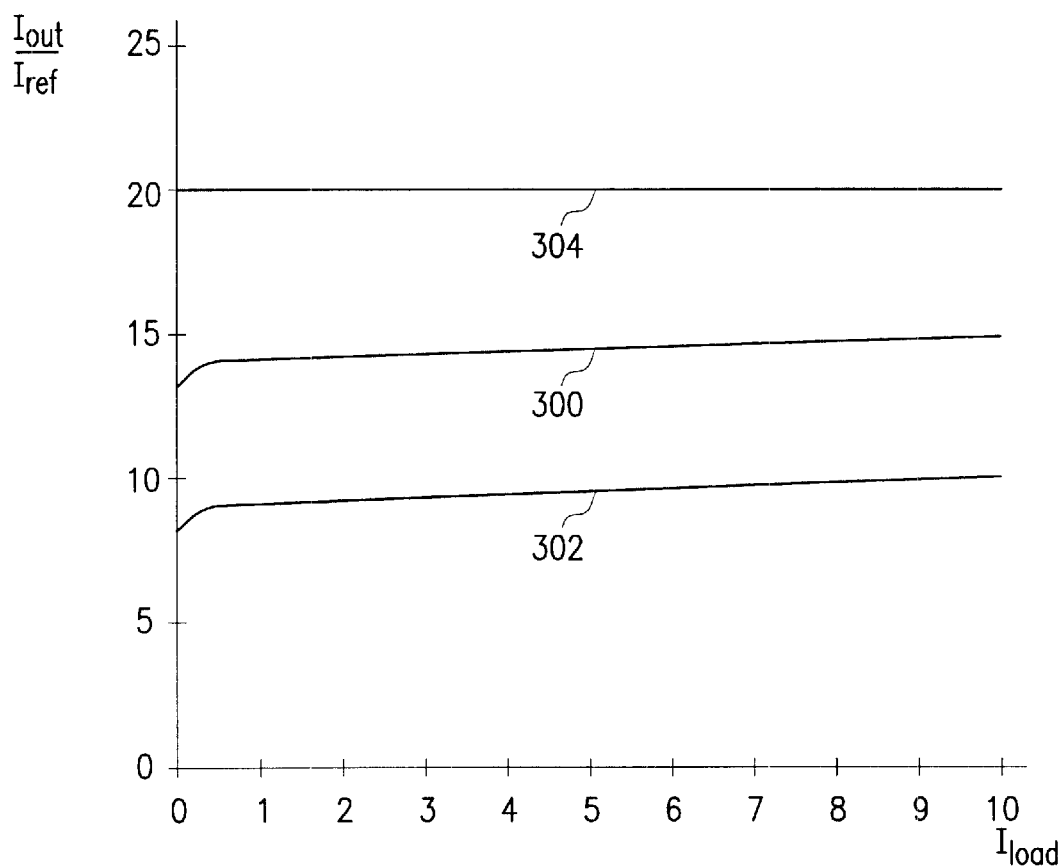
FIG. 7 is a graph illustrating a comparison in the DC operating characteristics between the amplifiers of FIGS. 1 and 3.

Reference is now made to FIG. 7 wherein there is shown a graph illustrating a comparison in the DC operating characteristics between the amplifiers of FIGS. 1 and 3. The x-axis plots the sensed current ($I_{load}$) while the y-axis plots the ratio of the output current ($I_{out}$) to the reference current $I_{ref}$ (which in the ideal case is the gain/amplification value n of the current sense amplifier). For each plotted curve shown in FIG. 7, some assumptions are made with respect to the configuration of the amplifiers 10 and 100, namely:

$R_{sense}$=10 mΩ;

R1=R2=R3=2 kΩ;

n=20;

$I_{bias}$=40 μA; and

β=60.

Curve 300 provides the DC characteristics of the amplifier 10 of FIG. 1 with Vcc set at 5V, and curve 302 provides the DC characteristics of the amplifier 10 of FIG. 1 with Vcc set at 2V. Two important things are noticed with respect to the curves 300 and 302. First, the curves 300 and 302, while having substantially the same shape, have different magnitudes resulting from a change in the value of Vcc. Operation of the amplifier 10 is accordingly not operationally stable with respect to changes in operating voltage. Second, the similar shape of the curves is noticeably sloped with an increase in the measured ratio of the output current ($I_{out}$) to the reference current $I_{ref}$ experienced as the sensed current ($I_{load}$) increases. Put another way, the gain of the amplifier changes with changes in the measured load current. It was noted above that a concern with the operation of the amplifier 10 of FIG. 1 was that the actual output current and the current $n \cdot I_{ref}$ differ from each other by a factor on the order of:

$$\left(n - \frac{1}{n} - 1\right)\Big/\beta.$$

This difference is illustrated by the slope of the curves 300 and 302, and further illustrates why, given a scenario where n is relatively large (for example, greater than or about ten) and β is relatively small (for example, less than or about sixty), the current sense amplifier circuit of FIG. 1 cannot be used for generating a precision current amplifier output.

Curve 304, on the other hand, provides the DC characteristics of the amplifier 100 of FIG. 3 with Vcc set at either 2V or 5V. In comparison to the curves 300 and 302, what is significantly noted about curve 304 is that it is not only identical for both 2V and 5V operation, but it is also substantially constant (no slope) with respect to changes in the measured load current. The amplifier 100 of FIG. 3 accordingly provides for substantially improved performance over the prior art circuit and is well suited to use in generating a precision current amplifier output. Curve 304 is also representative of the operation of amplifiers 100', 200 and 200' illustrated in FIGS. 4, 5 and 6, respectively.

It is accordingly suggested that the amplifier of the present invention provides a circuit having: a simple configuration, good power supply rejection ratio, accurate current gain setting through resistor ratio; a large amplification factor (for example, at or exceeding twenty); a wide range of output voltage; and support of low Vcc values.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A current sense amplifier, comprising:
   a transconductance amplifier measuring a current passing through a sense resistor to generate a reference current indicative of the measured current;
   a current mirror circuit connected to the transconductance amplifier to amplify the reference current and generate an amplified output current; and
   a cascode circuit connected between the current mirror circuit and an output of the generated amplified output current.

2. The amplifier as in claim 1 wherein the connection of the cascode circuit to the current mirror circuit boosts an output impedance for the amplifier with respect to the generated amplified output current.

3. The amplifier as in claim 1 wherein a value calculated from a ratio of the output current to the reference current is substantially stable with respect to changes in the measured current passing through the sense resistor.

4. The amplifier as in claim 1 wherein a value calculated from a ratio of the output current to the reference current is substantially stable with respect to changes in amplifier operating voltage over a range extending from about 2V to about 5V.

5. The amplifier as in claim 1 wherein the current mirror circuit comprises a first pair of transistors sharing a first common control node, and wherein the cascode circuit comprises a second pair of transistors sharing a second common control node, and wherein the first and second pairs of transistors are connected serially with each other to effectuate the connection of the cascode circuit and the current mirror circuit.

6. The amplifier as in claim 5 wherein the serial connection is accomplished by connecting a node of a first transistor in the first pair of transistors to a node of a first transistor in the second pair of transistors, and connecting a node of a second transistor in the first pair of transistors to a node of the second transistor in the second pair of transistors.

7. The amplifier as in claim 6 wherein the transconductance amplifier comprises:
   an operational amplifier having an output; and
   a transistor having a control node connected to the operational amplifier output.

8. The amplifier as in claim 7 wherein the transistor of the transconductance amplifier is the first transistor in the first pair of transistors comprising the current mirror circuit.

9. The amplifier as in claim 7 wherein a node of the first transistor in the second pair of transistors is connected to an input of the operational amplifier to receive the reference current.

10. The amplifier as in claim 7 wherein the first pair of transistors are matched transistors and the second pair of transistors are matched transistors.

11. The amplifier as in claim 1 wherein the recited components of the current sense amplifier are implemented on an integrated circuit chip.

12. A current sense amplifier, comprising:
   an operational amplifier having an output and a pair of inputs connected across a sense resistor to measure a current passing therethrough and generate at one of the inputs a reference current indicative of the measured current;
   a first pair of transistors having a first common control node connected to the output of the operational amplifier;
   a second pair of transistors having second common control node, a first transistor of the second pair connected to receive the reference current and a second transistor of the second pair connected to an output of the current sense amplifier, wherein the first pair of transistors and the second pair of transistors are connected serially.

13. The current sense amplifier as in claim 12 wherein the operational amplifier and a first transistor of the first pair of transistors form a transconductance amplifier.

14. The current sense amplifier as in claim 12 wherein the first pair of transistors form a current mirror.

15. The current sense amplifier as in claim 12 wherein the second pair of transistors form a cascode circuit.

16. The current sense amplifier as in claim 12 wherein the recited components of the current sense amplifier are implemented on an integrated circuit chip.

17. The current sense amplifier as in claim 12 wherein the serial connection comprises:
   connecting a node of a first transistor in the first pair of transistors to a first node of the first transistor in the second pair of transistors; and
   connecting a node of a second transistor in the first pair of transistors to a first node of the second transistor in the second pair of transistors.

18. The current sense amplifier as in claim 17 wherein a second node of the first transistor in the second pair is connected to the input of the operational amplifier to receiver the reference current and a second node of the second transistor in the second pair is connected to the output of the current sense amplifier.

19. The current sense amplifier as in claim 12 wherein the serial connection boosts an output impedance for the amplifier with respect to the generated amplified output current.

20. The current sense amplifier as in claim 12 wherein a value calculated from a ratio of the output current to the reference current is substantially stable with respect to changes in the measured current passing through the sense resistor.

21. The current sense amplifier as in claim 12 wherein a value calculated from a ratio of the output current to the reference current is substantially stable with respect to changes in amplifier operating voltage over a range extending from about 2V to about 5V.

22. A current sense amplifier, comprising:

a differential amplifier having an output and a pair of inputs connected across a sense resistor to measure a current passing therethrough and generate at one of the inputs a reference current indicative of the measured current;

a first transistor pair having a first common control node connected to a bias voltage, a first one of the transistors connected to the differential amplifier input to conduct the reference current and a second one of the transistors conducting an output current;

a second transistor pair having a second common control node connected to the output of the operational amplifier, the second transistor pair connected serially to the first transistor pair such that a first one of the transistors for the second transistor pair also conducts the reference current and a second one of the transistors for the second transistor pair also conducts the output current.

23. The amplifier as in claim 22 wherein the second transistor pair effectuates a 1:n gain enhancement of the reference current to the output current.

24. The amplifier as in claim 23 wherein the second transistor pair forms a current mirror.

25. The amplifier as in claim 22 wherein the first transistor pair boosts an output impedance for the amplifier with respect to the generated output current.

26. The amplifier as in claim 25 wherein the first transistor pair forms a cascode circuit.

27. The amplifier as in claim 22 wherein a value calculated from a ratio of the output current to the reference current is substantially stable with respect to changes in the measured current passing through the sense resistor.

28. The amplifier as in claim 22 wherein a value calculated from a ratio of the output current to the reference current is substantially stable with respect to changes in amplifier operating voltage over a range extending from about 2V to about 5V.

* * * * *

UNITED STATES PATENT AND TRADEMARK OFFICE
CERTIFICATE OF CORRECTION

PATENT NO.    : 6,492,845 B1
DATED         : December 10, 2002
INVENTOR(S)   : Weiguo Ge et al.

Page 1 of 1

It is certified that error appears in the above-identified patent and that said Letters Patent is hereby corrected as shown below:

Column 4,
Line 5, replace "$ti\ I_{ref} = I_{load}\ (R_{sense}/R1).$" with -- $I_{ref} = I_{load}\ (R_{sense}/R1).$ --

Signed and Sealed this

Twenty-fifth Day of March, 2003

JAMES E. ROGAN
*Director of the United States Patent and Trademark Office*